United States Patent
Lu et al.

(10) Patent No.: US 9,748,349 B2
(45) Date of Patent: Aug. 29, 2017

(54) SEMICONDUCTOR DEVICE

(71) Applicant: UNITED MICROELECTRONICS CORP., Hsin-Chu (TW)

(72) Inventors: Chia-Lin Lu, Taoyuan (TW); Chun-Lung Chen, Tainan (TW); Kun-Yuan Liao, Hsin-Chu (TW); Feng-Yi Chang, Tainan (TW); Chieh-Te Chen, Kaohsiung (TW); Wei-Hao Huang, New Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/723,467

(22) Filed: May 28, 2015

(65) Prior Publication Data
US 2016/0322468 A1 Nov. 3, 2016

(30) Foreign Application Priority Data
Apr. 30, 2015 (CN) .......................... 2015 1 0216099

(51) Int. Cl.
*H01L 29/423* (2006.01)
*H01L 21/768* (2006.01)
*H01L 29/78* (2006.01)
*H01L 29/51* (2006.01)

(52) U.S. Cl.
CPC .. *H01L 29/42364* (2013.01); *H01L 21/76831* (2013.01); *H01L 21/76895* (2013.01); *H01L 21/76897* (2013.01); *H01L 29/51* (2013.01); *H01L 29/518* (2013.01); *H01L 29/785* (2013.01)

(58) Field of Classification Search
None
See application file for complete search history.

(56) References Cited

U.S. PATENT DOCUMENTS

| | | | | |
|---|---|---|---|---|
| 5,960,318 | A * | 9/1999 | Peschke | H01L 21/76816 257/E21.577 |
| 7,157,782 | B1 * | 1/2007 | Shih | H01L 27/0203 257/50 |
| 8,237,228 | B2 * | 8/2012 | Or-Bach | G03F 9/7076 257/369 |
| 9,147,748 | B1 * | 9/2015 | Xie | H01L 29/66545 |
| 9,390,981 | B1 * | 7/2016 | Basker | H01L 21/82381 |
| 2002/0146899 | A1 * | 10/2002 | Chun | H01L 21/76831 438/618 |
| 2007/0099414 | A1 * | 5/2007 | Frohberg | H01L 21/76877 438/618 |
| 2009/0101968 | A1 * | 4/2009 | Sugioka | H01L 29/41791 257/327 |
| 2009/0159978 | A1 * | 6/2009 | Matsubara | H01L 21/76897 257/368 |

(Continued)

*Primary Examiner* — William Coleman
*Assistant Examiner* — Kien Ly
(74) *Attorney, Agent, or Firm* — Winston Hsu (57) ABSTRACT

A semiconductor device is disclosed. The semiconductor device includes: a substrate; a gate structure on the substrate; an interlayer dielectric (ILD) around the gate structure; a first contact plug in the ILD layer; a second dielectric layer on the ILD layer; a second contact plug in the second dielectric layer and electrically connected to the first contact plug; and a spacer between the second contact plug and the second dielectric layer.

12 Claims, 7 Drawing Sheets

(56) References Cited

U.S. PATENT DOCUMENTS

| | | | | |
|---|---|---|---|---|
| 2009/0323387 A1* | 12/2009 | Lin | ................... | H01L 27/112 |
| | | | | 365/94 |
| 2010/0327346 A1* | 12/2010 | Jeong | ............... | H01L 21/76804 |
| | | | | 257/332 |
| 2011/0095394 A1* | 4/2011 | Chih | ................. | H01L 23/5252 |
| | | | | 257/530 |
| 2011/0210447 A1* | 9/2011 | Seidel | .............. | H01L 21/76808 |
| | | | | 257/774 |
| 2012/0139015 A1* | 6/2012 | Yu | ..................... | H01L 21/28518 |
| | | | | 257/288 |
| 2012/0139061 A1* | 6/2012 | Ramachandran | . | H01L 21/76895 |
| | | | | 257/410 |
| 2013/0119474 A1* | 5/2013 | Schultz | ............ | H01L 21/76895 |
| | | | | 257/368 |
| 2014/0315379 A1* | 10/2014 | He | ......................... | H01L 29/78 |
| | | | | 438/595 |
| 2014/0367773 A1* | 12/2014 | Poelzl | .............. | H01L 29/66666 |
| | | | | 257/330 |
| 2015/0340374 A1* | 11/2015 | Jung | ................ | H01L 27/11573 |
| | | | | 438/258 |
| 2016/0133623 A1* | 5/2016 | Xie | ...................... | H01L 27/088 |
| | | | | 257/384 |
| 2016/0133721 A1* | 5/2016 | Cai | .................... | H01L 29/4958 |
| | | | | 257/506 |

* cited by examiner

SEMICONDUCTOR DEVICE

BACKGROUND OF THE INVENTION

1. Field of the Invention

The invention relates to a semiconductor device, and more particularly to a semiconductor device having spacer between contact plug and dielectric layer.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

However, integration of metal gate and contact plugs still faces some issues in conventional FinFET fabrication. For instance, issues such as tiger tooth often arise when contact holes are formed with poor accuracy influencing the interconnection of contact plugs and overall performance of the device. Hence, how to improve the current FinFET fabrication and structure for resolving this issue has become an important task in this field.

SUMMARY OF THE INVENTION

According to a preferred embodiment of the present invention, a semiconductor device is disclosed. The semiconductor device includes: a substrate; a gate structure on the substrate; an interlayer dielectric (ILD) around the gate structure; a first contact plug in the ILD layer; a second dielectric layer on the ILD layer; a second contact plug in the second dielectric layer and electrically connected to the first contact plug; and a spacer between the second contact plug and the second dielectric layer.

According to another aspect of the present invention, a semiconductor device includes: a substrate; a gate structure on the substrate; an interlayer dielectric (ILD) around the gate structure; a first contact plug in the ILD layer; a second dielectric layer on the ILD layer; a second contact plug in the second dielectric layer and electrically connected to the first contact plug and the gate structure; and a spacer between the second contact plug and the second dielectric layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
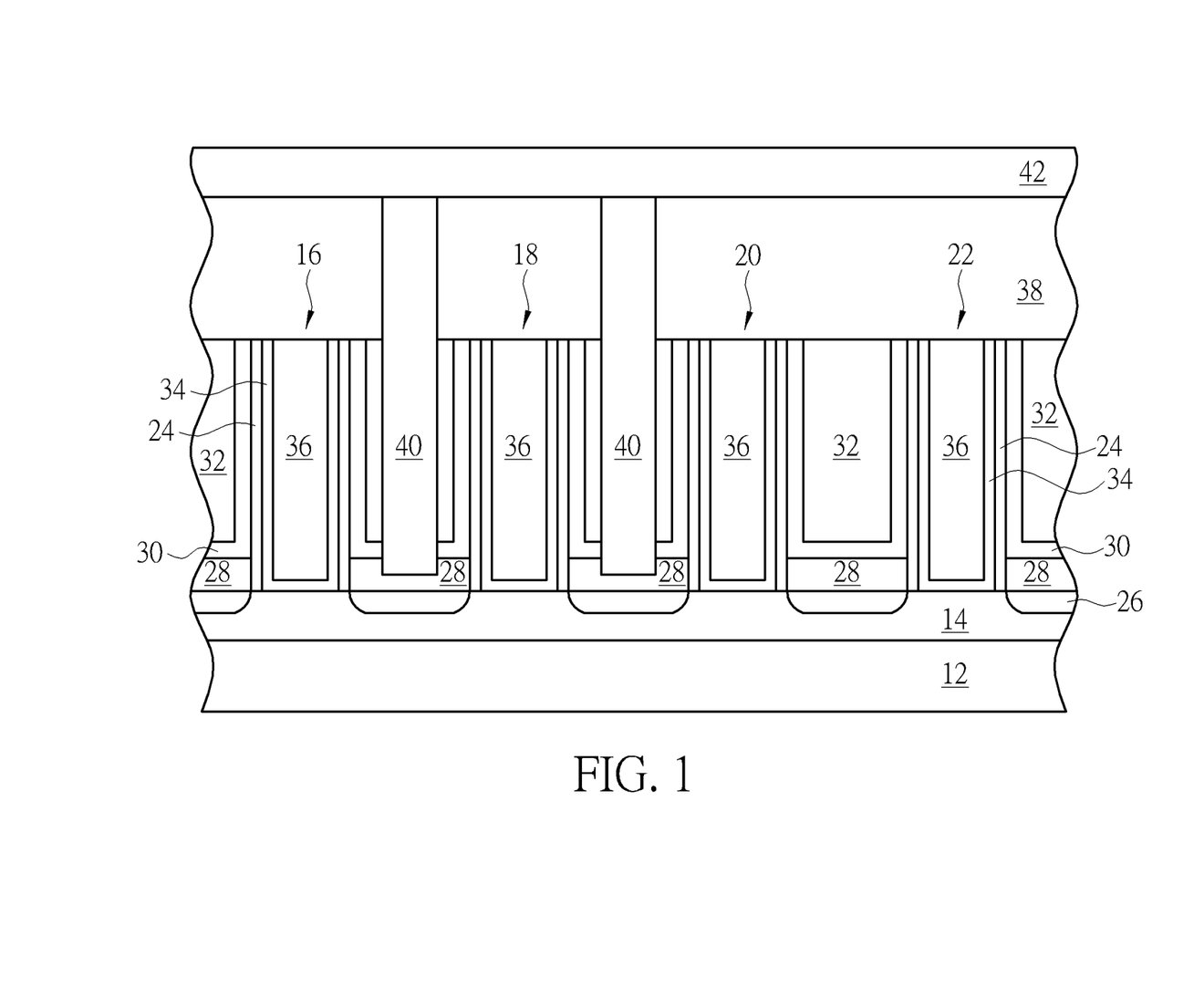
FIGS. 1-3 illustrate a method for fabricating semiconductor device according to a preferred embodiment of the present invention.
Figure 2:
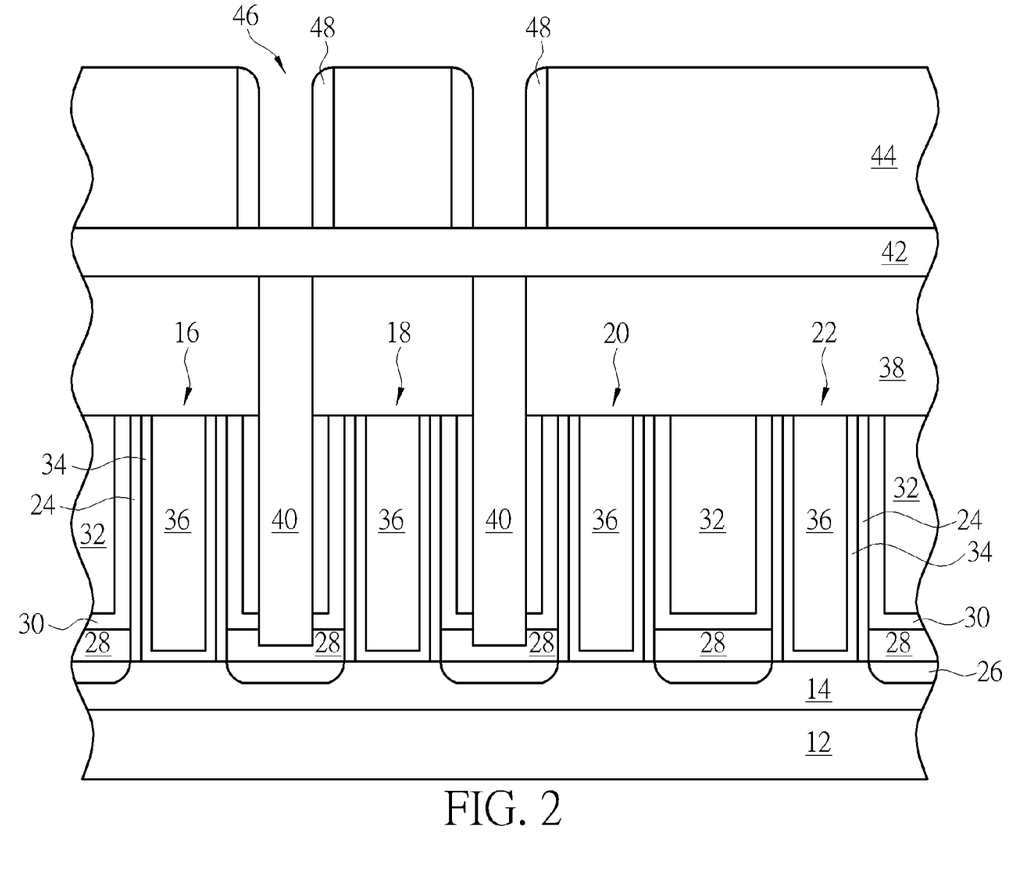
Figure 3:
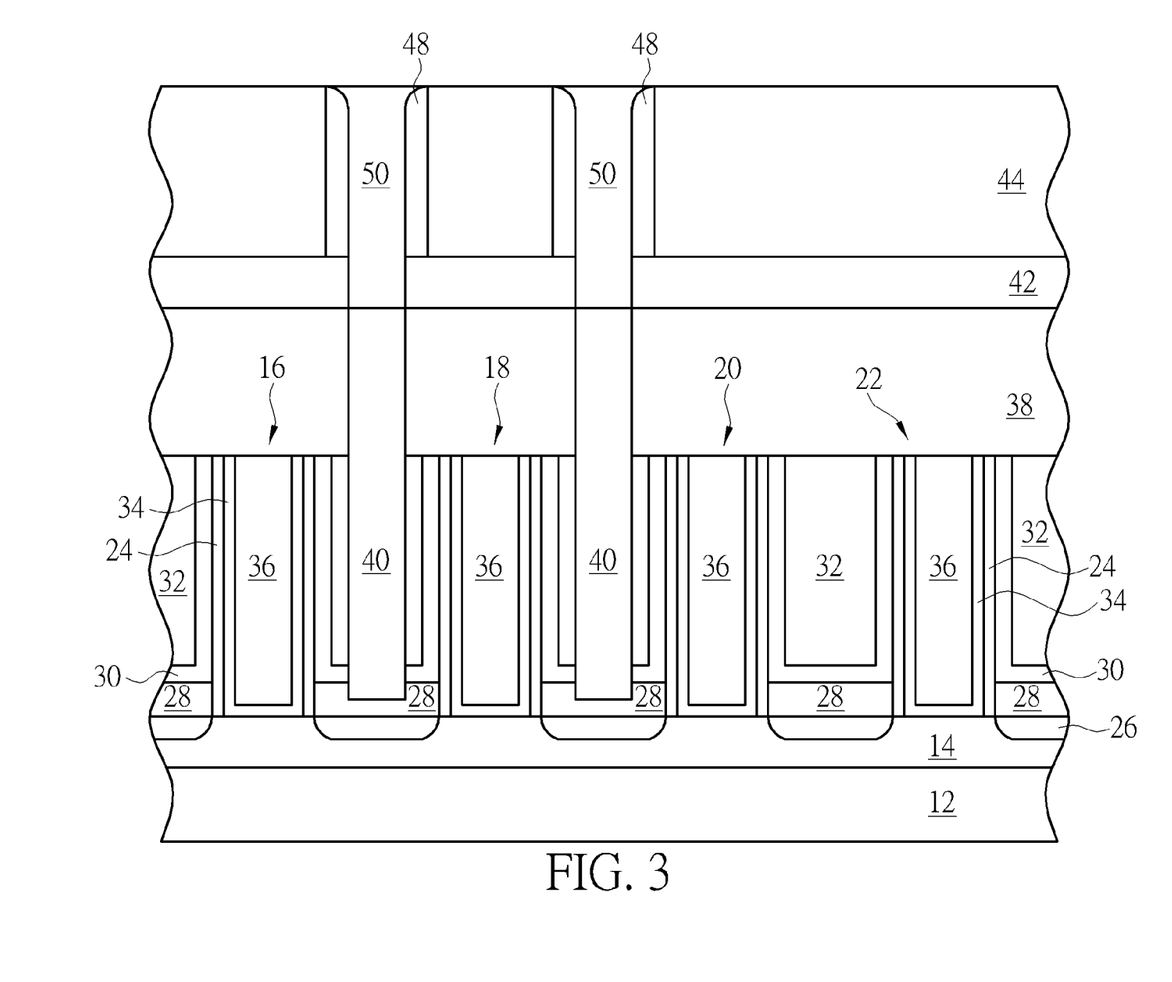

Referring to FIGS. 1-3, FIGS. 1-3 illustrate a method for fabricating semiconductor device according to a preferred embodiment of the present invention. As shown in FIG. 1, a substrate 12, such as a silicon substrate or silicon-on-insulator (SOI) substrate is provided, and a transistor region, such as a PMOS region or a NMOS region is defined on the substrate 12. At least a fin-shaped structure 14 and an insulating layer (not shown) are formed on the substrate 12, in which the bottom of the fin-shapes structure 14 is preferably enclosed by the insulating layer, such as silicon oxide to form a shallow trench isolation (STI). A plurality of gate structures 16, 18, 20, 22 are formed on part of the fin-shaped structure 14. It should be noted that even though four gate structures are disclosed in this embodiment, the quantity of the gate structures is not limited to four, but could by any quantity depending on the demand of the product.

The formation of the fin-shaped structure 14 could be accomplished by first forming a patterned mask (now shown) on the substrate, 12, and an etching process is performed to transfer the pattern of the patterned mask to the substrate 12. Next, depending on the structural difference of a tri-gate transistor or dual-gate fin-shaped transistor being fabricated, the patterned mask could be stripped selectively or retained, and deposition, chemical mechanical polishing (CMP), and etching back processes are carried out to form an insulating layer surrounding the bottom of the fin-shaped structure 14. Alternatively, the formation of the fin-shaped structure 14 could also be accomplished by first forming a patterned hard mask (not shown) on the substrate 12, and then performing an epitaxial process on the exposed substrate 12 through the patterned hard mask to grow a semiconductor layer. This semiconductor layer could then be used as the corresponding fin-shaped structure 14. In another fashion, the patterned hard mask could be removed selectively or retained, and deposition, CMP, and then etching back could be used to form a STI surrounding the bottom of the fin-shaped structure 14. Moreover, if the substrate 12 were a SOI substrate, a patterned mask could be used to etch a semiconductor layer on the substrate until reaching a bottom oxide layer underneath the semiconductor layer to form the corresponding fin-shaped structure. If this means is chosen the aforementioned steps for fabricating the STI could be eliminated.

The fabrication of the gate structures 16, 18, 20, 22 could be accomplished by a gate first process, a high-k first approach from gate last process, or a high-k last approach from gate last process. Since this embodiment pertains to a high-k first approach, dummy gates (not shown) composed of high-k dielectric layer and polysilicon material could be first formed on the fin-shaped structure 14, and a spacer 24 is formed on the sidewall of the dummy gates. A source/drain region 26 and/or epitaxial layer 28 are then formed in the fin-shaped structure 14 and/or substrate 12 adjacent to two sides of the spacer 24, a silicide layer (not shown) could be selectively formed on the source/drain region 26 and/or epitaxial layer 28, a contact etch stop layer (CESL) 30 is formed on the dummy gates, and an interlayer dielectric (ILD) layer 32 composed of tetraethyl orthosilicate (TEOS) is formed on the CESL 30.

Next, a replacement metal gate (RMG) process could be conducted to planarize part of the ILD layer 32 and CESL 30 and then transforming the dummy gates into gate structures 16, 18, 20, 22 composed of metal gates. The RMG process could be accomplished by first performing a selective dry etching or wet etching process, such as using etchants including ammonium hydroxide (NH$_4$OH) or tetramethylammonium hydroxide (TMAH) to remove the polysilicon layer from dummy gates for forming a recess (not shown) in the ILD layer 32. Next, a conductive layer including at least a U-shaped work function metal layer 34 and a low resistance metal layer 36 is formed in the recess, and a planarizing process is conducted so that the surfaces of the U-shaped work function layer 34 and low resistance metal layer 36 are even with the surface of the ILD layer 32. Depending on the high-k first approach or high-k last approach being conducted, the cross-section of high-k dielectric layer (not shown) could be either I-shaped or U-shaped.

In this embodiment, the work function metal layer 34 is formed for tuning the work function of the later formed metal gates to be appropriate in an NMOS or a PMOS. For an NMOS transistor, the work function metal layer 34 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 34 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 34 and the low resistance metal layer 36, in which the material of the barrier layer may include titanium (Ti), titanium nitride (TiN), tantalum (Ta) or tantalum nitride (TaN). Furthermore, the material of the low-resistance metal layer 36 may include copper (Cu), aluminum (Al), titanium aluminum (TiAl), cobalt tungsten phosphide (CoWP) or any combination thereof. Since the process of using RMG process to transform dummy gate into metal gate is well known to those skilled in the art, the details of which are not explained herein for the sake of brevity.

Next, a first dielectric layer 38 is deposited on the gate structures 16, 18, 20, 22 and ILD layer 32, and a photo-etching process is conducted to remove part of the first dielectric layer 38, part of the ILD layer 32, and part of the CESL 30 to form a plurality of contact holes (not shown) exposing the epitaxial layer 28. Metal materials including a barrier layer material selected from the group consisting of Ti, TiN, Ta, and TaN and a low resistance material selected from the group consisting of W, Cu, Al, TiAl, and CoWP are then deposited into each of the contact holes. A planarizing process, such as CMP process is carried out to remove part of the metal materials to form a contact plug 40 in each contact hole to electrically connect to the source/drain region 26, and a stop layer 42 is deposited on the first dielectric layer 38 and the contact plugs 40 thereafter. In this embodiment, the first dielectric layer 38 and stop layer 42 are preferably composed of different material, in which the first dielectric layer 38 is preferably composed of silicon oxide while the stop layer 42 is composed of silicon nitride, but not limited thereto.

Next, as shown in FIG. 2, a second dielectric layer 44 is formed on the stop layer 42, and a photo-etching process is conducted to remove part of the second dielectric layer 44 to form plurality of contact holes 46 corresponding to the contact plugs 40 and exposing the stop layer 42 surface. Next, an atomic layer deposition (ALD) process is conducted to form a material layer (not shown) on the second dielectric layer 44 and filled into the contact holes 46, and an etching process is carried out to remove part of the material layer on second dielectric layer 44 surface and part of the material layer on stop layer 42 surface for forming spacers 48 in the contact holes 46.

Next, as shown in FIG. 3, another contact plug formation process is conducted by first removing part of the stop layer 42 and then depositing metal materials into the contact holes 46, in which the metal materials could include a barrier layer material selected from the group consisting of Ti, TiN, Ta, and TaN and a low resistance material selected from the group consisting of W, Cu, Al, TiAl, and CoWP. A planarizing process, such as CMP process is carried out thereafter to remove part of the metal materials to form contact plugs 50 in contact holes 46 for electrically connecting the contact plugs 40. This completes the fabrication of a semiconductor device according to a preferred embodiment of the present invention.

Referring again to FIG. 3, which further illustrates a structural view of a semiconductor device. As shown in FIG. 3, the semiconductor device preferably includes a substrate 12, a plurality of gate structures 16, 18, 20, 22 disposed on the substrate 12, a ILD layer 32 around the gate structures 16, 18, 20, 22 while the top surfaces of the ILD layer 32 and the gate structures 16, 18, 20, 22 being coplanar, a first dielectric layer 38 disposed on the ILD layer 32 and the gate structures 16, 18, 20, 22, a plurality of contact plugs 40 disposed within the ILD layer 32 and the first dielectric layer 38 while the top surfaces of the contact plugs 40 and first dielectric layer 38 being coplanar, a stop layer 42 disposed on the first dielectric layer 38, a second dielectric layer 44 disposed on the stop layer 42, a plurality of contact plugs 50 disposed within the stop layer 42 and second dielectric layer 44 and electrically connected to the contact plugs 40 underneath, and a spacer 48 disposed between the contact plugs 50 and second dielectric layer 44 and above the stop layer 42. In this embodiment, the first dielectric layer 38 and second dielectric layer 44 are preferably composed of silicon oxide, and the stop layer 42 is composed of silicon nitride. The spacer 48 is preferably composed of a dielectric material different from the second dielectric layer 44 and stop layer 42, such as a material selected from the group consisting of silicon oxide, silicon nitride, silicon oxynitride, and silicon carbon nitride. Alternatively, the spacer 48 could also be composed of conductive material similar to the aforementioned barrier layer, such as a material selected from the group consisting of Ti, TiN, Ta, and TaN.

Figure 4:
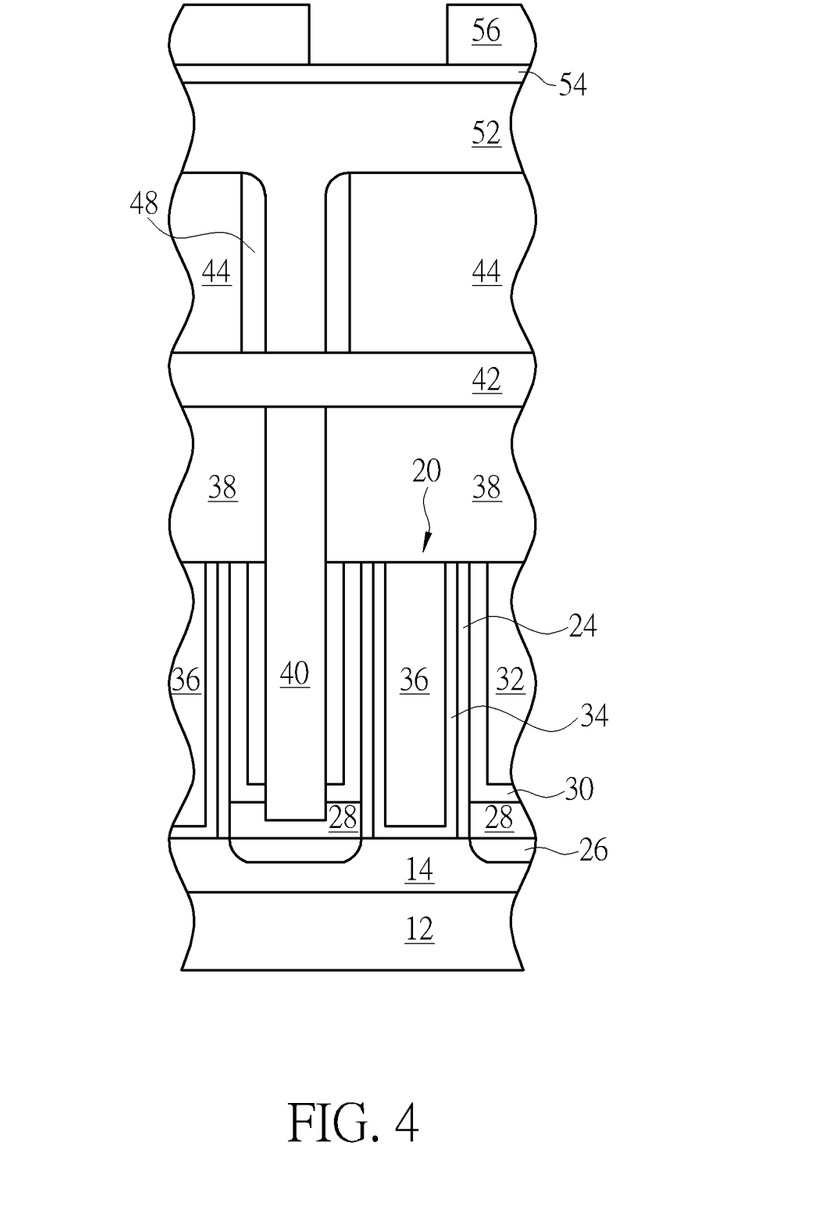
FIGS. 4-7 illustrate a method for fabricating semiconductor device according to another embodiment of the present invention.

Referring to FIGS. 4-7, FIGS. 4-7 illustrate a method for fabricating semiconductor device according to another embodiment of the present invention. As shown in FIG. 4, fabrication steps disclosed in FIGS. 1-2 are first conducted to form elements including a gate structure 20 consisting of U-shaped work function layer 34 and low resistance metal layer 36, spacer 24, source/drain region 26, epitaxial layer 28, CESL 30, and ILD layer 32 on the substrate 12. It should be noted even though only one gate structure 20 is disclosed in this embodiment, the quantity of gate structure in actual fabrication process is not limited to one, but could be adjusted according to the demand of the process.

Next, a first dielectric layer 38 is formed on the gate structure 20 and ILD layer 32, a contact plug 40 is formed within the ILD layer 32 and first dielectric layer 38 to electrically connect to the source/drain region 26, a stop layer 42 and a second dielectric layer 44 are formed sequentially on the first dielectric layer 38 and contact plug 40, part of the second dielectric layer 44 is removed through etching process to form a contact hole, and a spacer 48 is formed within the contact hole.

Next, a mask layer, such as an organic dielectric layer (ODL) 52, a silicon-containing hard mask bottom anti-reflective coating (SHB) 54, and a patterned resist 56 are sequentially formed on the second dielectric layer 44 and the spacer 48, in which the ODL 52 preferably fills the contact hole between the spacer 48.

Figure 5:
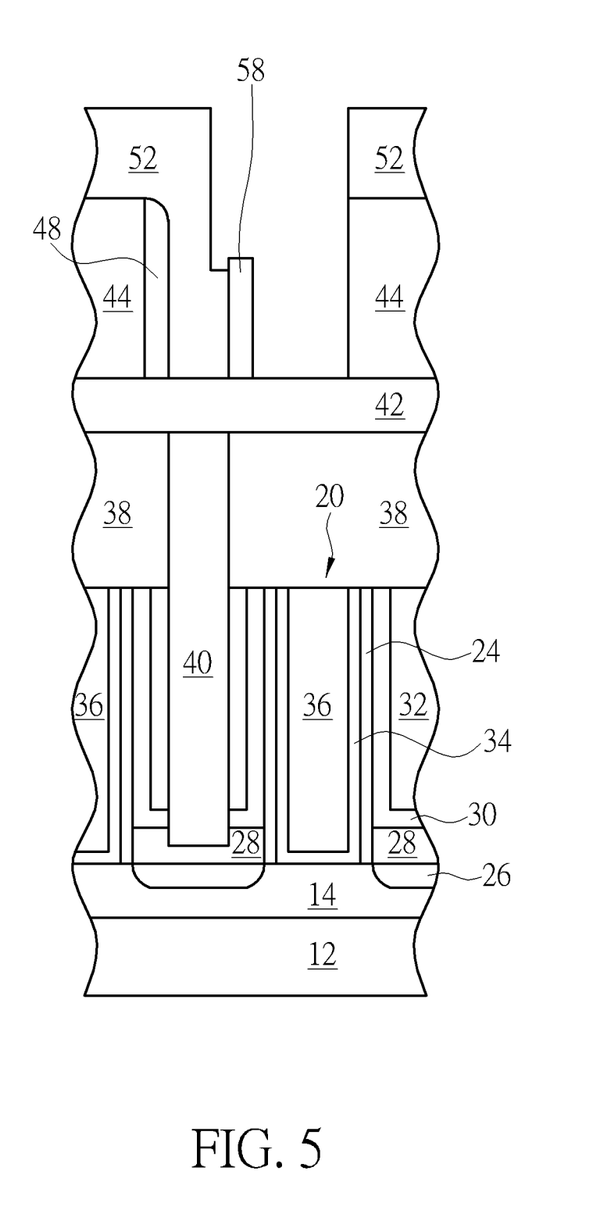

Next, as shown in FIG. 5, an etching process is conducted by using the patterned resist 56 as mask to remove part of the SHB 54 and part of the ODL 52 for exposing the second dielectric layer 44 surface above the gate structure 20. The etching process is then continued to remove part of the second dielectric layer 44 directly above the gate structure 20 and stop on the stop layer 42, in which the patterned resist 56 and SHB 54 could be consumed during the process when part of the second dielectric layer 44 is removed, or another etching process could be carried out selectively to remove the patterned resist 56 and SHB 54. In this embodiment, part of the spacer 48 within the second dielectric layer 44 and between the gate structure 20 and contact plug 40 is removed during the removal of the patterned resist 56. This forms a truncated spacer 58 and the top surface of the truncated spacer 58 is slightly lower than the top surface of the original spacer 48 situating aside.

Figure 6:
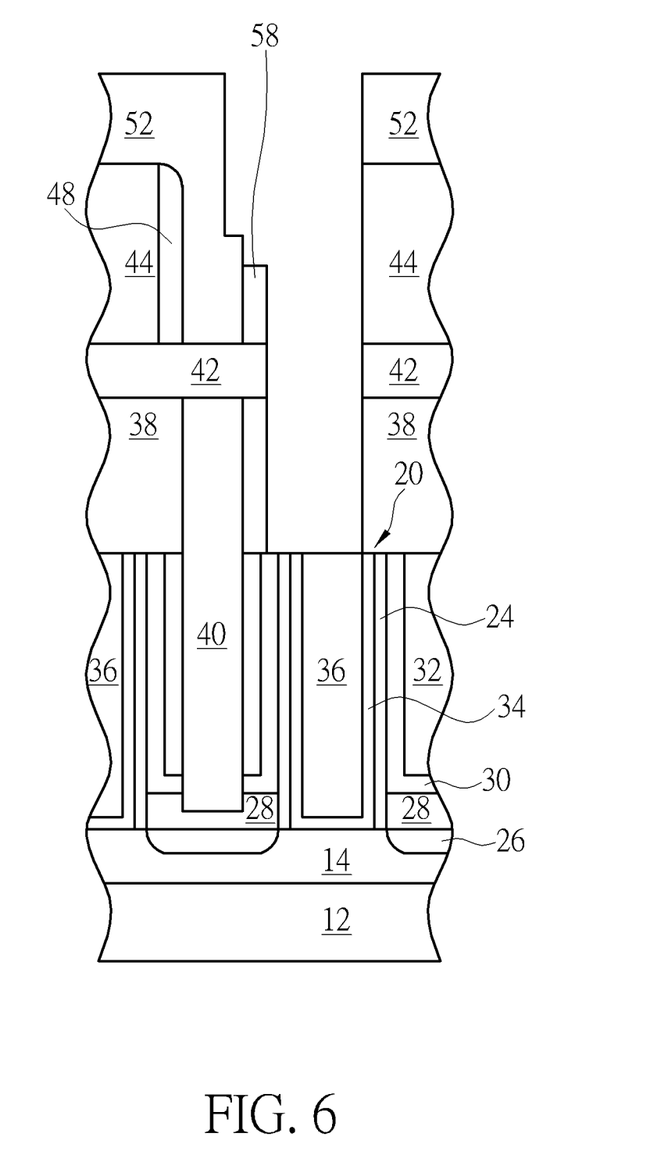

Next, as shown in FIG. 6, another etching process is conducted by using the ODL 52 as mask to remove part of the stop layer 42 and part of the first dielectric layer 38 directly above the gate structure 20 for exposing the top surface of gate structure 20. It should be noted that the truncated spacer 58 is preferably etched again during the etching process of the stop layer 42 and first dielectric layer 38 so that the height of the truncated spacer 58 is lowered once more.

Figure 7:
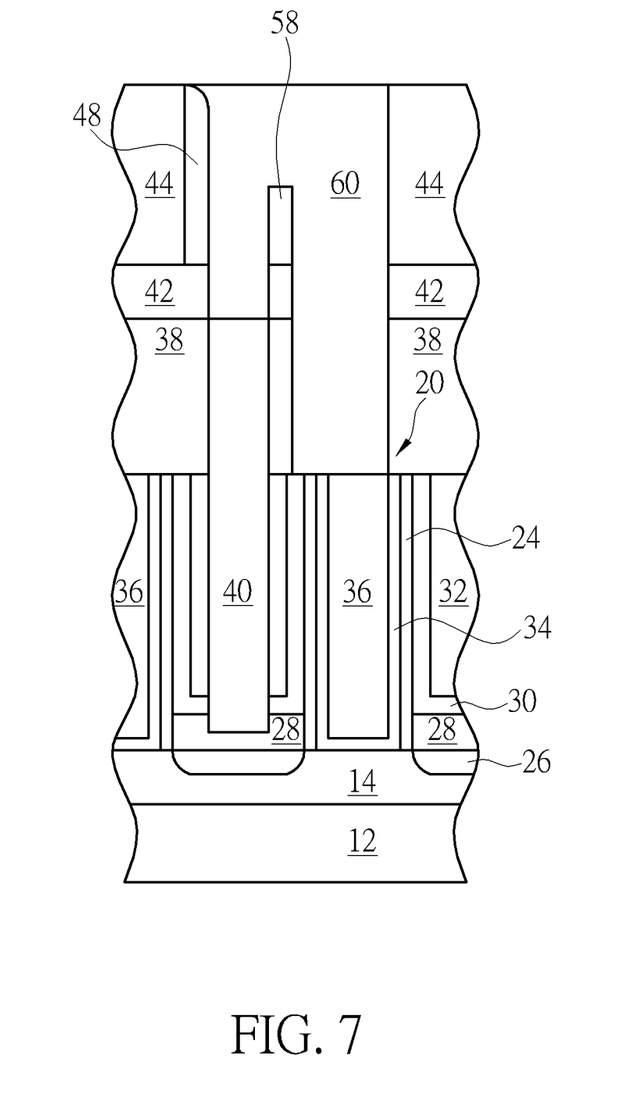

Next, as shown in FIG. 7, an ash process is conducted to remove the ODL 52, and another etching process is carried out to remove part of the stop layer 42 directly above the contact plug 40 for forming an opening (not shown) exposing the contact plug 40 and gate structure 20 surface. Metal materials are then deposited into the opening, in which the metal materials could include a barrier layer material selected from the group consisting of Ti, TiN, Ta, and TaN and a low resistance material selected from the group consisting of W, Cu, Al, TiAl, and CoWP. A planarizing process, such as CMP process is carried out thereafter to remove part of the metal materials to form a contact plug 60 electrically connecting the contact plug 40 and gate structure 20 at the same time.

Referring again to FIG. 7, which further illustrates a structural view of a semiconductor device according to another embodiment of the present invention. As shown in FIG. 7, the semiconductor device includes a substrate 12, a gate structure 20 disposed on the substrate 12, a ILD layer 32 around the gate structure 20, a first dielectric layer 38 disposed on the ILD layer 32 and gate structure 20, a contact plug 40 disposed within the ILD layer 32 and first dielectric layer 38, a stop layer 42 disposed on the first dielectric layer 38, a second dielectric layer 44 disposed on the stop layer 42, a contact plug 60 disposed within the first dielectric layer 38, stop layer 42, and second dielectric layer 44 and electrically connected to the contact plug 40 and gate structure 20, a spacer 48 disposed between the contact plug 40 and second dielectric layer 44, and a truncated spacer 58 disposed between the contact plug 40 and gate structure 20. In this embodiment, the first dielectric layer 38 and second dielectric layer 44 are preferably composed of silicon oxide, the stop layer 42 is composed of silicon nitride, and the spacer 48 and truncated spacer 58 are preferably selected from the group consisting of silicon oxide, silicon nitride, silicon oxynitride, and silicon carbon nitride. Alternatively, the spacer 48 and truncated spacer 58 could also be composed of conductive material similar to the aforementioned barrier layer, such as a material selected from the group consisting of Ti, TiN, Ta, and TaN.

It should be noted that the spacer of this embodiment further includes a spacer 48 and truncated spacer 58 surrounding the contact plug 60 directly above the contact plug 40, in which the spacer 48 is disposed between the contact plug 40 and second dielectric layer 44 and the top surfaces of the spacer 48 and second dielectric layer 44 are coplanar. The truncated spacer 58 on the other hand is disposed within the second dielectric layer 44 and between the contact plug 40 and gate structure 20, in which the top surface of the truncated spacer 58 is between the top and bottom surfaces of the second dielectric layer 44, or even lower than half the overall height of the second dielectric layer 44.

According to an embodiment of the present invention, it would also be desirable to remove the truncated spacer 58 completely during the aforementioned fabrication processes so that contact plug 60 within the second dielectric layer 44 and between the contact plug 40 and gate structure 20 would directly contact the stop layer 42, or no spacer is remained in the second dielectric layer 44 above and between the contact plug 40 and gate structure 20, which is also within the scope of the present invention.

Overall, the present invention preferably forms a spacer between the dielectric layer and contact plug above ILD layer and gate structure, in which the contact plug is electrically connected to the source/drain region adjacent to two sides of the gate structure. According to a preferred embodiment of the present invention, the spacer is specifically placed to fill enlarged gap adjacent to the contact holes so that tiger tooth issue commonly occurred during the formation of contact plug in conventional art could be prevented effectively.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate;
   a gate structure on the substrate, wherein a bottom surface of the gate structure is even with a top surface of the substrate;
   a source/drain region adjacent to two sides of the gate structure;
   an interlayer dielectric (ILD) layer around the gate structure;
   a first dielectric layer on top of the ILD layer;
   a first contact plug in the ILD layer and contacting the first dielectric layer and the source/drain region directly;
   a second dielectric layer on the ILD layer;
   a second contact plug in the second dielectric layer and contacting the first contact plug and the gate structure directly, wherein the second contact plug is disposed on top of the gate structure and the source/drain region; and
   a spacer on the first dielectric layer and between the second contact plug and the second dielectric layer;
   wherein a bottom surface of the first dielectric layer contacts a top surface of the ILD layer and a top surface of the gate structure directly.

2. The semiconductor device of claim 1, further comprising:
- a stop layer on the first dielectric layer; and
- the second contact plug in the stop layer, the first dielectric layer, and the second dielectric layer.

3. The semiconductor device of claim 2, wherein the stop layer comprises silicon nitride.

4. The semiconductor device of claim 2, wherein the stop layer contacts the spacer, the first dielectric layer, and the second dielectric layer directly.

5. The semiconductor device of claim 1, wherein the first dielectric layer and the second dielectric layer comprise silicon oxide.

6. The semiconductor device of claim 1, wherein the spacer is selected from the group consisting of silicon oxide, silicon nitride, silicon oxynitride, and silicon carbon nitride.

7. The semiconductor device of claim 1, further comprising a truncated spacer in the second dielectric layer and between the first contact plug and the gate structure.

8. The semiconductor device of claim 7, wherein two sidewalls of the truncated spacer contact the second contact plug directly.

9. The semiconductor device of claim 7, wherein a sidewall of the truncated spacer is aligned with an edge of the first contact plug.

10. The semiconductor device of claim 1, wherein the first contact plug contacts the ILD layer directly.

11. The semiconductor device of claim 1, wherein the spacer contacts the second dielectric layer directly.

12. The semiconductor device of claim 1, wherein the top surfaces of the first contact plug and the first dielectric layer are coplanar.

* * * * *